United States Patent
Wakui

(10) Patent No.: US 6,448,723 B1
(45) Date of Patent: Sep. 10, 2002

(54) STAGE SYSTEM AND EXPOSURE APPARATUS

(75) Inventor: Shinji Wakui, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/645,611

(22) Filed: Aug. 25, 2000

(30) Foreign Application Priority Data

Aug. 26, 1999 (JP) .......................................... 11-239378

(51) Int. Cl.[7] .............................................. H02K 41/00
(52) U.S. Cl. ................................. 318/135; 318/568.18
(58) Field of Search ........................... 310/12; 700/280; 188/378; 73/662; 318/135, 568.17, 568.18; 74/490.9, 490.13

(56) References Cited

U.S. PATENT DOCUMENTS

| | | | |
|---|---|---|---|
| 5,187,519 A | * 2/1993 | Takabayashi et al. | 355/53 |
| 5,504,407 A | 4/1996 | Wakui et al. | 318/568.17 |
| 5,511,930 A | 4/1996 | Sato et al. | 414/676 |
| 5,568,032 A | 10/1996 | Wakui | 318/632 |
| 5,653,317 A | 8/1997 | Wakui | 188/378 |
| 5,900,707 A | 5/1999 | Wakui | 318/625 |
| 6,175,404 B1 | * 1/2001 | Lee | 355/53 |
| 6,213,442 B1 | * 4/2001 | Ivers et al. | 248/550 |
| 6,286,644 B1 | * 9/2001 | Wakui | 188/378 |

FOREIGN PATENT DOCUMENTS

| | | |
|---|---|---|
| JP | 4-365314 | 12/1992 |
| JP | 7-237061 | 9/1995 |
| JP | 8-170990 | 7/1996 |

* cited by examiner

Primary Examiner—Nestor Ramirez
Assistant Examiner—Judson H. Jones
(74) Attorney, Agent, or Firm—Fitzpatrick, Cella, Harper & Scinto

(57) ABSTRACT

A stage system includes a movable stage, a position measuring device for measuring the position of the stage, a velocity sensor for detecting the velocity of the stage, and a control unit having a position feedback loop based on an output of the position measuring device and a feedback loop for applying a damping to the stage on the basis of an output of the velocity sensor. With the addition of the feedback loop for applying the damping to the stage by using an output of the velocity sensor, a strong braking function is provided, such that the positioning settlement time can be shortened.

6 Claims, 2 Drawing Sheets

STAGE SYSTEM AND EXPOSURE APPARATUS

FIELD OF THE INVENTION AND RELATED ART

This invention relates to a stage system and, more particularly, a stage control system wherein, in addition to feedback of a position signal, feedback of a velocity signal is performed to thereby improve the position settling characteristic. The stage control system can be suitably used in a semiconductor exposure apparatus, for example, to increase the precision and productivity.

The requirement applied to a kinetic mechanism is simple. It is to move a thing fast and precisely. In order to meet this, the basic stance of the mechanical design should pursue a kinetic mechanism of light weight and high rigidity. To this end, mechanical designs have been made with the use of a material or materials having a high specific rigidity. However, when motion of a mechanism is considered, namely, when the mass (M), rigidity (K) and viscous damping (C) are taken into account, it can be stated that only M and K are designed in conventional mechanical designs. Practically, when a light weight and high rigidity kinetic mechanism is manufactured and then control is made thereto, the problem which arises therefrom is a high frequency resonance phenomenon. When a light weight and high rigidity structure is accomplished, a mechanical vibration in a high frequency region can be produced, as is well known in the art. Here, when the control is conventional, that is, if the setting is such that the kinetic mechanism does not move fast, the mechanical resonance will be in a high region outside the control band and, therefore, it will not adversely affect the kinetic performance. However, the controller for a light weight and high rigidity kinetic mechanism is so adjusted to move the same fast. Namely, the closed loop frequency characteristic is set in a higher frequency region. As a result, even when a light weight and high rigidity kinetic mechanism is manufactured and the resonance frequency of the mechanism is set to be a high frequency, since the closed loop frequency response is also at a high frequency, the resonance of the mechanism largely influences the kinetic performance.

This problem is attributable to that, in the mechanical design, the viscous damping (C) is not designed in addition to the mass (M) and rigidity (K). This means that the viscous damping (C) should be designed in the mechanical design. Conventionally, however, there is no established design formula in regard to the viscous damping (C) and, therefore, it is not possible to fully meet the requirement. What can be best done may be predicting a possible mechanical resonance in the mechanism designing and conveniently inserting a viscous damping element such as a rubber element. Alternatively, if an unexpected resonance occurs after the mechanism is manufactured, similarly a viscous damping element such as a rubber element may be inserted to apply a damping function to suppress the vibration. As described above, in order to provide a fast and high precision kinetic mechanism, how to design the damping function is very important.

In the situations described above, in the field of kinetic control, research and development on the "damping technology" is a very important theme. In fact, there is a special committee in the Japan Society of Mechanical Engineers in regard to the damping technology. The importance and extension of this field can be recognized.

In the field of motion control of a mechanism, because of difficulties in applying a damping function by use of mechanism means, generally the damping control is made by the feedback of an output of an acceleration sensor. For example, use of an acceleration sensor is inevitable, in a suspension control of vehicles for better comfort or an active vibration control unit (usually called an "active mass damper") for vibration control of a structure. This is because high sensitivity and small size acceleration sensors are easily obtainable and they can be incorporated into a controlled object. However, from the viewpoint of damping application to a kinetic mechanism, an output of a velocity sensor rather than an acceleration sensor directly represents a physical amount.

Now, the damping application will be considered with respect to an X–Y stage in a semiconductor exposure apparatus, as a representative example of a high precision kinetic mechanism. To such an X–Y stage, there is a feedback system based on an output of a laser interferometer. For example, in a position control system, an output signal of a laser interferometer is compared with a position command profile, and a positional deviation signal is produced. Then, PID compensation is made to this deviation signal to energize an actuator for driving the X–Y stage. A closed loop is thus accomplished. The control is made only to a single loop based on the output of the laser interferometer. Here, P denotes "proportional", I denotes "integration", and D denotes "differentiation". What applies damping to the motion of the stage is only D (differentiation) in the PID compensation.

With such a single feedback loop, however, practically, it is difficult to perform the adjustment fully satisfying the requirements applied to the X–Y stage. If possible, the performance to follow a position command input and the performance of suppression to an external disturbance input must be shared. If a velocity feedback loop can be added, in addition to the position feedback loop, it effectively contributes to shortening the settling time. From the point of design control, it is evident that the control performance can be improved by multiplying the feedback loop. Practically, however, the control loop of the stage is not multiplied. This is because there are physical restrictions in machine design or the effectiveness of multiplying the feedback loop is not known. Alternatively, there is no specific way for multiplying the control system of an X–Y stage. Namely, there is not exact knowledge as to which physical amount of the X–Y stage should be measured to add a loop inside the feedback loop based on the output of the laser interferometer.

The present invention aims at improving the position settlement, in the positioning control of a precision positioning mechanism such as an X–Y stage of a semiconductor exposure apparatus, for example, by using a damping loop in addition to a position feedback loop based on a laser interferometer, for example.

Attempts for improving the positioning settlement performance of an X–Y stage through the damping application are made in some documents. For example, Japanese Laid-Open Patent Application, Laid-Open No. 237061/1995, shows a stage system wherein a protrusion is formed on the bottom face of a movable stage and wherein the protrusion is dipped in a viscous fluid. By moving the protrusion upwardly and downwardly, the contact amount with the viscous fluid changes to thereby adjust the viscous resistance. Thus, in this stage system, by adjusting the damping amount, the movable stage can be positioned at a predetermined position without bunching. In the stage system disclosed in this document, the damping is applied by arranging the mechanism specifically. Also, Japanese Laid-Open Patent Application, Laid-Open No. 170990/1996 shows a stage system wherein, as a viscous fluid, an ER (Electro-Reological) fluid having a viscous resistance coefficient variable with an electric field is used, and wherein the damping coefficient based on the viscous resistance coefficient of the viscous fluid is changed by using a control system to thereby provide a variable rigidity of an anti-vibration mount. In this manner, occurrence of vibration or the like due to the movement of the stage is suppressed.

In the former document, the viscous damping element is incorporated into the stage itself as its structure. It is seen from this document that many efforts have been made to provide the damping application to shorten the positioning settlement time of the stage. In this document, the damping is applied mechanically and, therefore, it needs complicated maintenance and adjustment operations. From the viewpoint of easy maintenance and for better absorption of dispersion of the stage positioning characteristic, applying the damping through the feedback control is preferable. The present invention provides a stage control system wherein the damping is applied through a feedback control.

As described above, a semiconductor exposure apparatus includes a stage for precise positioning. In order to meet the high speed drive, it uses a static pressure for the guide. In such a non-contact guide, in most cases, there is substantially no damping element. Therefore, when the stage is driven, it can be moved faster because of no resistance. However, when the stage is stopped, the settling characteristic is not good because there is no damping element. In conventional stage control systems, an output of a laser interferometer for measuring the position of the stage is fed back, and a differentiating element is added to the compensation calculation of this loop by which the damping is applied to the stage. However, the damping applied to such a feedback loop is insufficient.

Further, the stage mechanism itself involves high frequency resonance. Usually, such mechanical resonance cannot be removed unless, during the mechanism design, some positive measurements of selecting a special material to produce internal attenuation are taken. With increased velocity of the stage, mechanical resonance is easily excited. Unless the damping is applied thereto, it is difficult to accomplish high speed drive of the stage as well as stopping it in a short time and with a good precision.

SUMMARY OF THE INVENTION

It is an object of the present invention to solve at least one of the problems described above.

In accordance with an aspect of the present invention, there is provided a stage system, comprising: a movable stage; position measuring means for measuring the position of said stage; a velocity sensor for detecting the velocity of said stage; and a control unit having a position feedback loop based on an output of said position measuring means and a feedback loop for applying a damping to said stage on the basis of an output of said velocity sensor.

Preferably, the stage system may further comprise (i) a position compensator for performing predetermined compensation to a position error signal determined on the basis of an output of said position measuring means and a command position, (ii) a velocity compensator communicated with said position compensator to direct an output of said velocity sensor as a negative feedback signal, and (iii) an electric current amplifier for energizing an actuator for driving said stage in accordance with an output of said velocity compensator.

Preferably, the stage system may further comprise (iv) a base plate for movably supporting said stage, and (v) an acceleration sensor for detecting an acceleration of said base plate, wherein said control unit includes means for applying a signal, corresponding to an output of said acceleration sensor as multiplied by a predetermined gain, to said current amplifier as positive feedback.

The stage may be supported by a base plate without contact thereto, with use of a static pressure bearing.

The stage may be driven by a linear motor.

In accordance with another aspect of the present invention, there is provided an exposure apparatus, comprising: a movable stage; position measuring means for measuring the position of said stage; a velocity sensor for detecting the velocity of said stage; and a control unit having a position feedback loop based on an output of said position measuring means and a feedback loop for applying a damping to said stage on the basis of an output of said velocity sensor.

Preferably, the apparatus may further comprise (i) a position compensator for performing predetermined compensation to a position error signal determined on the basis of an output of said position measuring means and a command position, (ii) a velocity compensator communicated with said position compensator to direct an output of said velocity sensor as a negative feedback signal, and (iii) an electric current amplifier for energizing an actuator for driving said stage in accordance with an output of said velocity compensator.

Preferably, the apparatus may further comprise (iv) a base plate for movably supporting said stage, and (v) an acceleration sensor for detecting an acceleration of said base plate, wherein said control unit includes means for applying a signal, corresponding to an output of said acceleration sensor as multiplied by a predetermined gain, to said current amplifier as positive feedback.

The stage may be supported by a base plate without contact thereto, with use of a static pressure bearing.

The stage may be driven by a linear motor.

In these aspects of the present invention, a velocity sensor is provided and an output thereof is fed back so as to apply a damping to the stage motion. Thus, there is a velocity feedback loop for applying the damping, in addition to the position feedback loop. This enables a strong damping effect by adjustment of the damping only.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Figure 1:
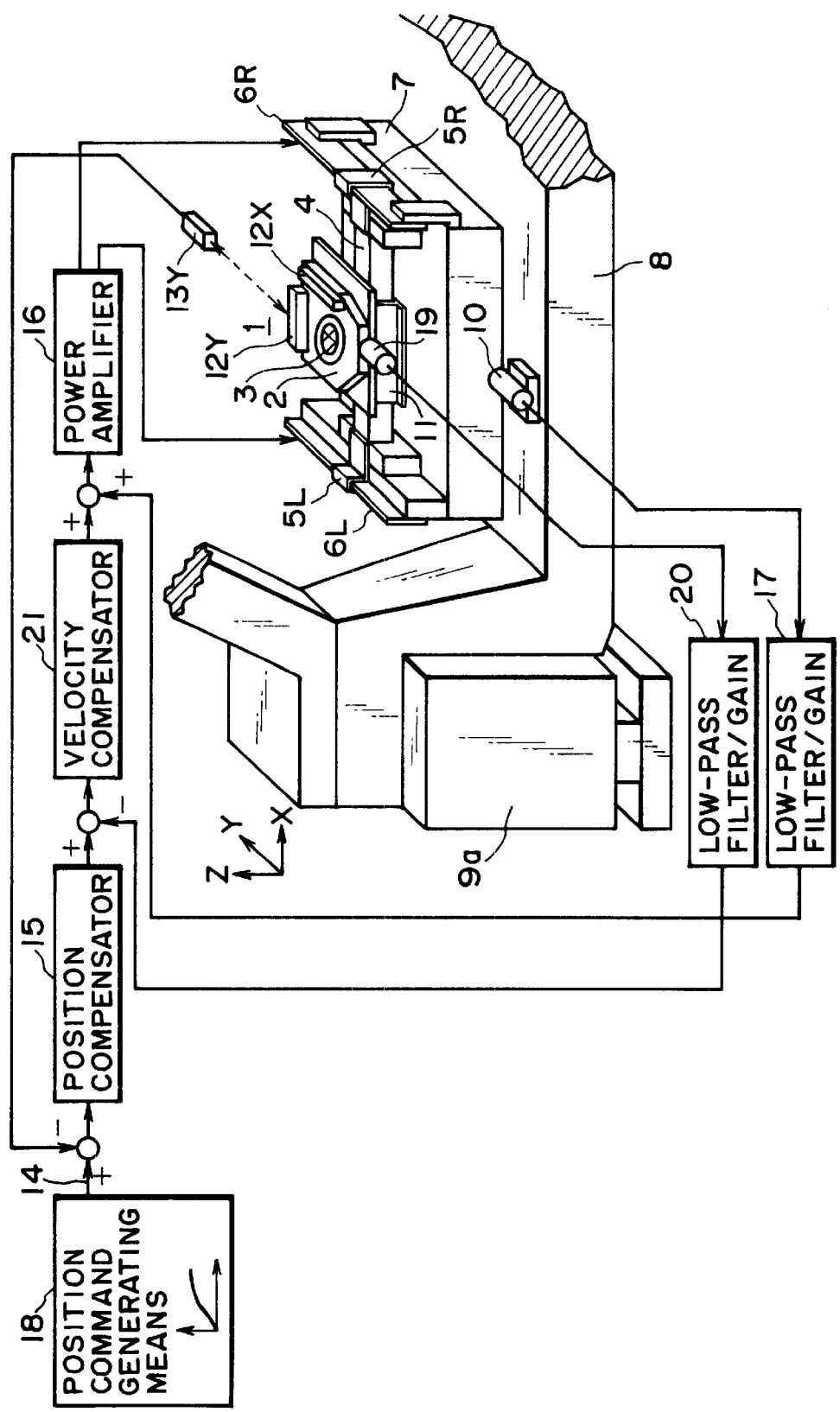
FIG. 1 is a schematic and diagrammatic view of a stage control system according to an embodiment of the present invention.
Figure 2:
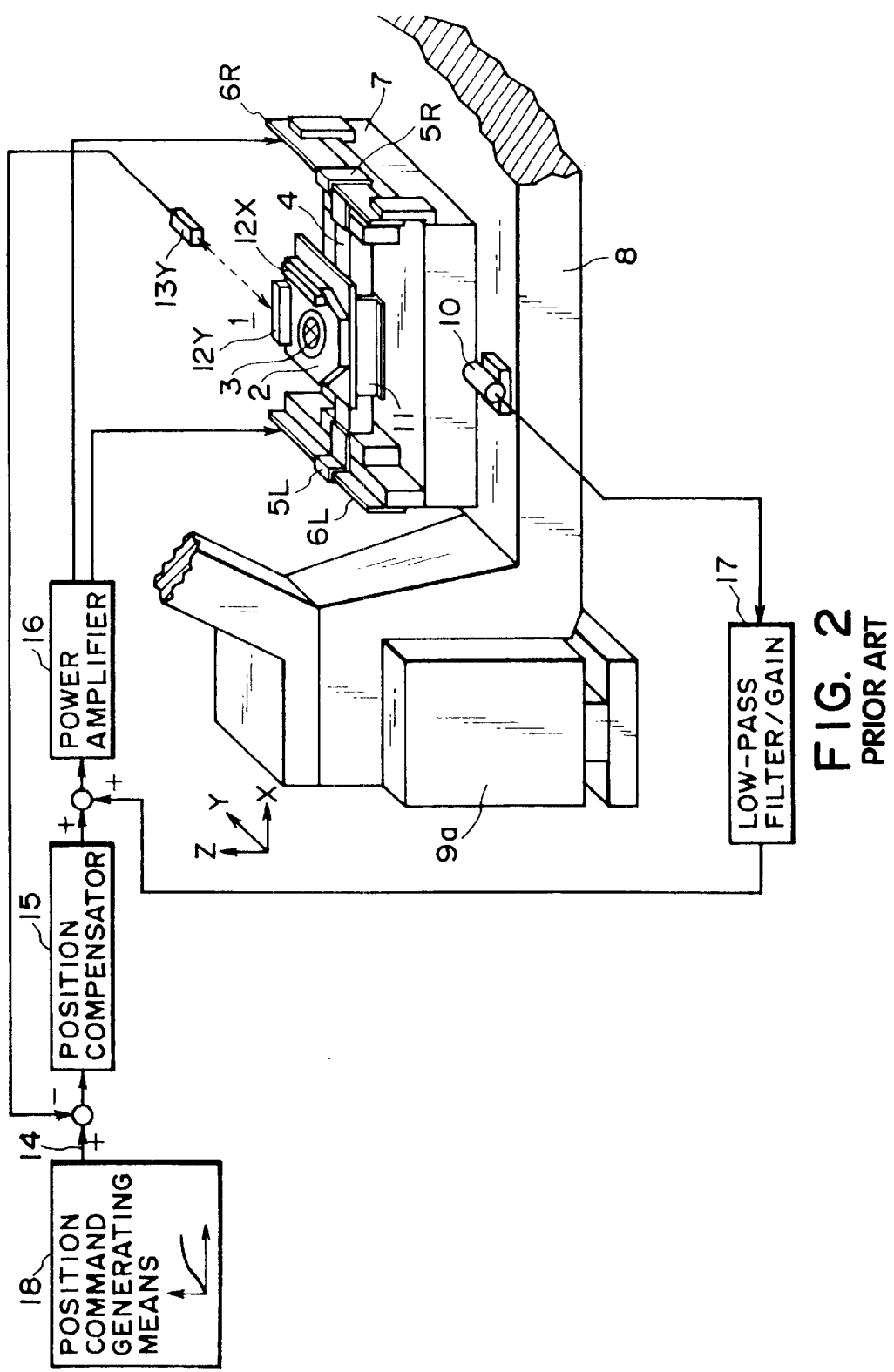
FIG. 2 is a schematic and diagrammatic view of a stage control system of a known example.

FIG. 1 shows a stage control system according to an embodiment of the present invention. FIG. 2 shows a conventional stage control system, for comparison. In these drawings, denoted at 1 is an X–Y stage, and denoted at 2 is a micro-moving stage mounted on an X-stage 11 for precision positioning of a semiconductor wafer 3. Denoted at 4 is a Y stage, and denoted at 5R and 5L are moving magnet type movable elements of linear motors for the positioning control of the Y stage 4. Denoted at 6R and 6L are coils (stators) of the linear motors. Denoted at 7 is a stage base plate, and denoted at 8 is a base plate which is supported by active supporting legs 9a and 9b (other two legs 9c and 9d are not shown) which constitute an active anti-vibration unit. Denoted at 10 is an acceleration sensor for the base plate acceleration feedback, which is mounted on the base plate 8 to detect an acceleration of the Y stage 4 in the positioning direction. Although not shown in the drawing, there is another acceleration sensor mounted on the base plate 8, for the base plate acceleration feedback.

The position of the Y stage 4 is measured by projecting a laser beam of a laser interferometer 13Y to a reflection mirror 12Y mounted on the micro-moving stage 2. The position measured value obtained thereby is compared with a position command value 14 for the Y stage 4 as outputted from the position command generating means 18, whereby a position error signal is produced. The signal passes through a position compensator 15 and energizes an electric current amplifier 16 for applying electric currents to the coils 6R and 6L of the linear motors. As regards the position compensator 15, a PID compensator may preferably be used, wherein P denotes "proportional", I denotes "integration", and D denotes "differentiation". With such a feedback loop, the stage can be moved and positioned at the position as specified by the position command value 14 without a steady-state error.

However, if the Y stage 4 is accelerated or decelerated rapidly, the drive reaction force oscillates the base plate 8. Since the laser interferometer 13Y is made integral with the base plate 8, the measured value with respect to the Y stage 4 also detects oscillation, like the base plate 8. Thus, the positioning convergence characteristic is damaged notably. In consideration of it, if the Y stage can be moved in accordance with this oscillation so that the distance between the laser interferometer 13Y and the reflection mirror 12Y can be held constant, the positioning convergence characteristic can be improved. A loop to be added to this end is a base plate acceleration feedback loop. Any oscillation of the base plate 8 in the Y-axis direction is measured by the acceleration sensor 10, and an output thereof is applied to an input terminal of the power amplifier 16 though a low-pass filter 17 having a suitable time constant for removing high frequency noises. The low-pass filter 17 has a function for performing gain adjustment as well as the filtering function. When the gain of the low-pass filter 17 is adjusted to provide a feedback amount corresponding to the movable mass of the Y stage 4, the base plate vibration to be superposed on the position error signal of the Y stage 4 is best suppressed. The structure and function described above commonly apply to the embodiment of FIG. 1 and to the example of FIG. 2.

In the structure described above, while the settling characteristic is improved by the application of the base plate acceleration feedback, it should be noted that the braking performance of the stage itself is not improved by this feedback. As described hereinbefore, what is done is that, by moving the Y stage 4 to follow the oscillation of the base plate 8, the measuring distance from the laser interferometer 13Y to the reflection mirror 12Y is held constant. This differs from applying a strong braking action to the Y stage 4 to position the same.

In the stage control system of this embodiment, in consideration of the above, as compared with the example in FIG. 2, a braking force is applied to the X–Y stage itself. More specifically, as shown in FIG. 1, there is a velocity sensor 19 for detecting the velocity of the Y stage in its driving direction. As regards a vibration sensor, an acceleration sensor is used widely and conveniently. However, in the present invention, a velocity sensor for detecting an absolute velocity is used. As regards such a velocity sensor, one which operates with a similar principle as a servo type acceleration sensor or a geophon sensor for detecting a velocity electromotive force is known, for example. The output of the velocity sensor 19 is applied to a low-pass filter 20 having a function for removing high frequency noises and for adjusting the velocity feedback gain. Then, the output is negative fed back to the input terminal of a velocity compensator 21. The velocity compensator 21 which is not included in the example of FIG. 2 is a compensator newly added to perform the feedback by using the output of the velocity sensor 19. With this feedback loop, a strong damping being controlled with respect to the motion of the Y stage 4 can be applied.

As well as the Y stage 4, the X stage 11 has a guiding mechanism based on a static pressure. Namely, because of the non-contact guide, no damping is applied, in terms of mechanism, to the movable parts of these stages. In the stage control system of the FIG. 2 example, the damping is provided by the position compensator 15. However, with the conventional control system having a position feedback loop only, only the damping adjustment cannot be performed while disregarding other performances applied to the position compensator 15 (e.g., making the steady state error to zero). In the embodiment of the present invention, a damping loop is provided separately, as contrasted to the FIG. 2 example. Thus, a strong damping can be applied. Applying a strong damping has an absolute effect. First, the Y stage 4 can be stopped by applying a strong braking against the motion thereof. Second, it has an advantageous effect of suppressing high frequency resonance of the mechanism where the Y stage 4 is incorporated. Further, there is an advantageous effect of strongly suppressing the disturbance to be applied to the Y stage 4. With these effects, the positional precision of the Y stage 4 can be improved significantly and, additionally, the positioning settling time can be shortened.

It is to be noted here that, in this embodiment, as compared with a case where the velocity of a driving mechanism is detected (for example, where the angular velocity of a rotational shaft of a ball screw is detected), the velocity of the stage which is the controlled positioning object is feedback-controlled. It is superior also in terms of the performance. Namely, even where there is no vibration in the driving unit but a disturbance is transmitted to the stage, this embodiment functions to suppress the detection of the absolute velocity of the stage. As a result, high precision positioning can be accomplished.

Although the foregoing description has been made with reference to a stage control system for the Y stage 4, a similar structure may, of course, be adopted in regard to the X stage 11. Further, while not shown in the drawing, a similar structure may be used in relation to a reticle stage (not shown) for carrying thereon a reticle having a circuit pattern to be printed on a semiconductor wafer 3 and for positioning the reticle thereon.

In accordance with the present invention, there are advantageous effects obtained, such as follows.

(1) A feedback loop for applying a damping to a stage is added by use of an output of a good quality velocity sensor. This enables applying a strong braking force and, thus, accomplishes shortening of the position settling time.

(2) A suitable damping can be applied to high frequency resonance being involved in a stage driving mechanism. Thus, there is an advantage that generation of the high frequency resonance is reduced when the closed loop frequency response of the stage is to be set in a higher region. Also, there is an advantage of reduced disturbance. Therefore, the present invention is largely contributable to higher precision stage positioning and higher speed stage positioning.

(3) Consequently, when the present invention is applied to a semiconductor exposure apparatus, it is largely contributable to enlargement of the productivity.

While the invention has been described with reference to the structures disclosed herein, it is not confined to the details set forth and this application is intended to cover such modifications or changes as may come within the purposes of the improvements or the scope of the following claims.

What is claimed is:

1. A stage system, comprising:

a movable stage;

positioning measuring means for measuring the position of said stage and for producing an output;

a velocity sensor for detecting the velocity of said stage and for producing an output;

a control unit having a position feedback loop based on the output of said position measuring means and a feedback loop for applying a damping to said stage on the basis of the output of said velocity sensor;

a position compensator for performing predetermined compensation to a position error signal determined on the basis of the output of said position measuring means and a command position;

a velocity compensator communicated with said position compensator to direct the output of said velocity sensor as a negative feedback signal;

an electric current amplifier for energizing an actuator for driving said stage in accordance with an output of said velocity compensator;

a base plate for movably supporting said stage; and an acceleration sensor for detecting an acceleration of said base plate and for producing an output, wherein said control unit includes means for applying a signal, corresponding to the output of said acceleration sensor as multiplied by a predetermined gain, to said current amplifier as positive feedback.

2. A stage system according to claim 1, further comprising a base plate for supporting said stage without contact thereto, with use of a static pressure bearing.

3. A stage system according to claim 1, further comprising a linear motor for driving said stage.

4. An exposure apparatus, comprising:

a movable stage;

position measuring means for measuring the position of said stage and for producing an output;

a velocity sensor for detecting the velocity of said stage and for producing an output;

a control unit having a position feedback loop based on the output of said position measuring means and a feedback loop for applying a damping to said stage on the basis of the output of said velocity sensor;

a position compensator for performing predetermined compensation to a position error signal determined on the basis of the output of said position measuring means and a command position;

a velocity compensator communicated with said position compensator to direct the output of said velocity sensor as a negative feedback signal;

an electric current amplifier for energizing an actuator for driving said stage in accordance with an output of said velocity compensator;

a base plate for movably supporting said stage; and an acceleration sensor for detecting an acceleration of said base plate and for producing an output, wherein said control unit includes means for applying a signal, corresponding to the output of said acceleration sensor as multiplied by a predetermined gain, to said current amplifier as positive feedback.

5. An apparatus according to claim 4, further comprising a base plate for supporting said stage without contact thereto, with use of a static pressure bearing.

6. An apparatus according to claim 4, further comprising a linear motor for driving said stage.

* * * * *

UNITED STATES PATENT AND TRADEMARK OFFICE
CERTIFICATE OF CORRECTION

PATENT NO.    : 6,448,723 B1
DATED         : September 10, 2002
INVENTOR(S)   : Shinji Wakui It is certified that error appears in the above-identified patent and that said Letters Patent is hereby corrected as shown below:

<u>Column 1,</u>
Line 13, "fast" should read -- quickly --.
Line 30, "fast," should read -- quickly, --.
Line 34, "fast." should read -- quickly. --

<u>Column 7,</u>
Line 15, "enlargement of" should read -- increasing --.

Signed and Sealed this

Eighteenth Day of February, 2003

JAMES E. ROGAN
*Director of the United States Patent and Trademark Office*